United States Patent
Kim et al.

(10) Patent No.: US 10,309,987 B2
(45) Date of Patent: Jun. 4, 2019

(54) PROBE AND PROBE CARD INCLUDING THE SAME

(71) Applicant: Samsung Electronics Co., Ltd., Suwon-si (KR)

(72) Inventors: Yu-Kyum Kim, Hwasung (KR); Gyu-Yeol Kim, Hwasung (KR); Jae-Won Kim, Hwasung (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/706,996

(22) Filed: Sep. 18, 2017

(65) Prior Publication Data

US 2018/0299490 A1    Oct. 18, 2018

(30) Foreign Application Priority Data

Apr. 18, 2017    (KR) .................. 10-2017-0049570

(51) Int. Cl.
*G01R 1/073*    (2006.01)
*G01R 1/067*    (2006.01)
*H04N 1/32*    (2006.01)
*H04N 1/00*    (2006.01)

(52) U.S. Cl.
CPC ..... *G01R 1/07357* (2013.01); *G01R 1/06705* (2013.01); *G01R 1/07314* (2013.01); *G01R 1/07342* (2013.01); *H04N 1/00342* (2013.01); *H04N 1/32138* (2013.01)

(58) Field of Classification Search
CPC ............ G01R 1/07357; G01R 1/06705; G01R 1/07314; G01R 1/07342; H04N 1/00342; H04N 1/32138
See application file for complete search history.

(56) References Cited

U.S. PATENT DOCUMENTS

| | | | |
|---|---|---|---|
| 7,952,375 B2 | 5/2011 | Eldridge et al. | |
| 2005/0179458 A1* | 8/2005 | Chen ................... | G01R 1/0483 324/755.07 |
| 2005/0184236 A1* | 8/2005 | Baur ...................... | G01N 1/28 250/311 |
| 2014/0253154 A1* | 9/2014 | Kang ................. | G01R 31/2874 324/750.03 |

FOREIGN PATENT DOCUMENTS

| | | |
|---|---|---|
| JP | 09-304433 A | 11/1997 |
| JP | 2003-021663 A | 1/2003 |
| JP | 2004-012212 A | 1/2004 |
| KR | 10-2005-0109331 A | 11/2005 |
| KR | 10-0472700 | 2/2006 |
| KR | 10-1638228 B1 | 7/2016 |

* cited by examiner

*Primary Examiner* — David M. Gray
*Assistant Examiner* — Michael A Harrison
(74) *Attorney, Agent, or Firm* — Muir Patent Law, PLLC

(57) ABSTRACT

A probe includes a beam and at least two tips. The beam transmits test signals to a device under test (DUT). The at least two tips are arranged on a first end portion of the beam in a direction at a predetermined angle to a length direction of the beam and contacts adjacent terminals of the DUT. The beam has a larger width that exceeds a sum of widths of the at least two tips in a width direction of the beam such that the probe has an improved current carrying capacity and is prevented from being damaged due to overcurrent.

20 Claims, 8 Drawing Sheets

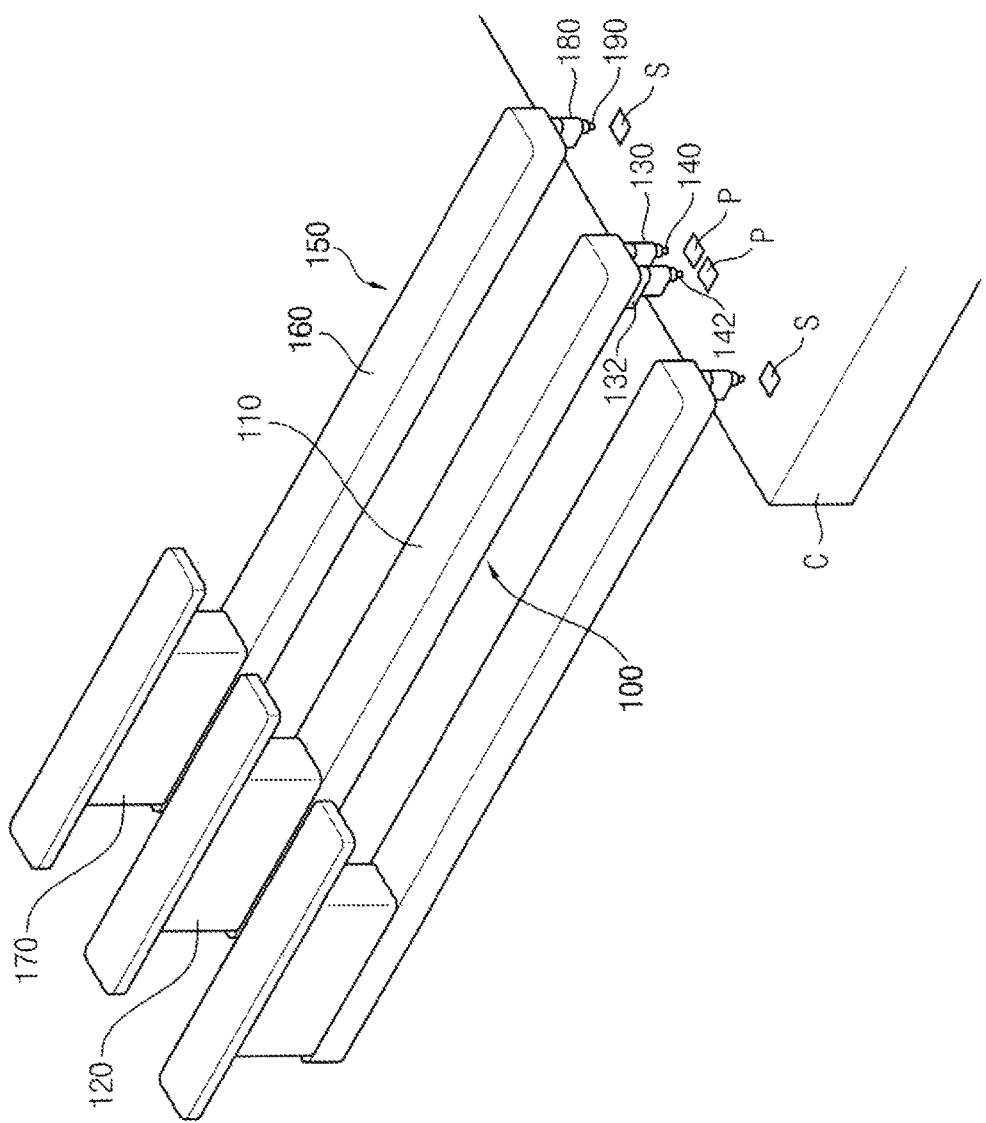

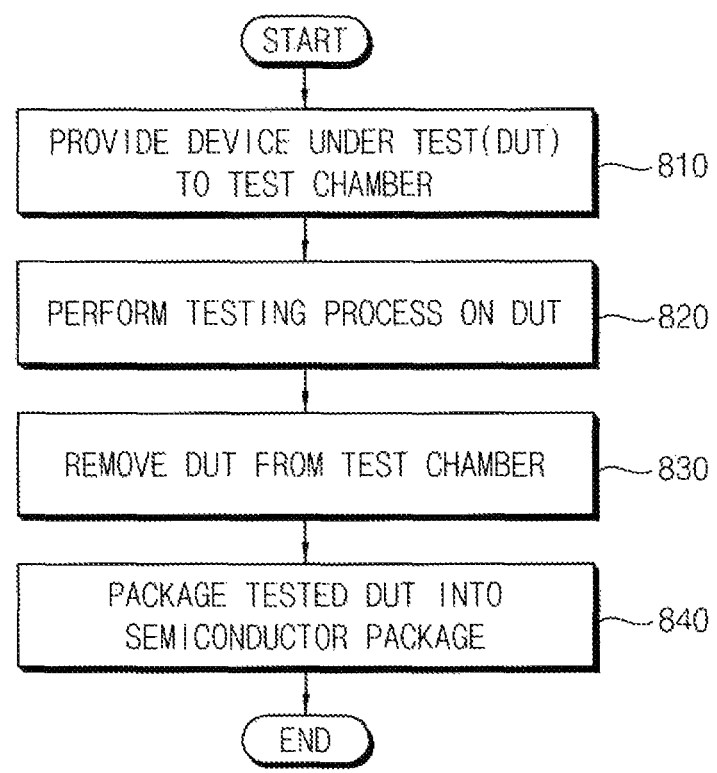

PROBE AND PROBE CARD INCLUDING THE SAME

CROSS-REFERENCE TO RELATED APPLICATION

This application claims the benefit of priority under 35 U.S.C. § 119 to Korean Patent Application No. 10-2017-0049570, filed on Apr. 18, 2017, in the Korean Intellectual Property Office, the disclosure of which is hereby incorporated by reference in its entirety.

TECHNICAL FIELD

Example embodiments of the present disclosure relate to a probe and a probe card including the same, and more specifically, to a probe for electrically contacting terminals of a device under test (DUT) and a probe card including the same.

DISCUSSION OF RELATED ART

A test signal can be applied to a semiconductor chip to test electrical characteristics thereof. The test signal is generated from a tester. A probe card is used to electrically connect the tester to the semiconductor chip. The probe card includes a printed circuit board and a probe. The printed circuit board is electrically connected to the tester. The probe is disposed on the printed circuit board and contacts pads of the semiconductor chip.

The probe includes a single tip for contacting the pads of the semiconductor chip. Since a distance between the pads of the semiconductor chip is small, the probe having the single tip has a narrow width to prevent contact with a neighboring probe. When the probe has a lower current carrying capacity (CCC), the probe having the narrow width may be damaged due to overcurrent.

SUMMARY

According to example embodiments, the present disclosure is directed to a method comprising: providing a device under test (DUT) to a test chamber; performing testing on the DUT using a probe; removing the DUT from the test chamber; and packaging the DUT into a semiconductor package, wherein the probe comprises: a beam configured to transmit a test signal to the DUT, the beam extending in a length direction and having a first end portion and a second end portion in the length direction; and at least two tips disposed on the first end portion of the beam and configured to contact adjacent terminals of the DUT and transmit the test signal to the DUT.

According to example embodiments, the present disclosure is directed to a method comprising: providing a device under test (DUT) to a test chamber; performing testing on the DUT using a probe card; removing the DUT from the test chamber; and packaging the DUT into a semiconductor package, wherein the probe card comprises: a printed circuit board (PCB) including a test pattern through which test signals for testing the DUT flow; a first probe including: a beam connected to the test pattern; and at least two first tips arranged on the beam with respect to one another in a direction at a predetermined angle relative to a length direction of the beam and configured to contact power pads of the DUT; and a second probe connected to the test pattern, the second probe including a second tip configured to contact a signal pad of the DUT.

According to example embodiments, the present disclosure is directed to a method comprising: providing a device under test (DUT) to a test chamber; performing testing on the DUT using a probe card; removing the DUT from the test chamber; and packaging the DUT into a semiconductor package, wherein the probe card comprises: a printed circuit board (PCB) including a test pattern through which test signals for testing the DUT flow; and a first probe including: a beam connected to the test pattern; and at least two first tips arranged on the beam with respect to one another in a direction at a predetermined angle relative to a first direction of the beam and configured to contact power pads of the DUT.

BRIEF DESCRIPTION OF THE DRAWINGS

FIG. 7 is an enlarged perspective view illustrating a contact relationship between first and second probes of the probe of FIG. 6 and pads of a semiconductor chip, according to example embodiments.

FIG. 8 is a flow chart illustrating a method of manufacturing a semiconductor device, according to example embodiments.

DETAILED DESCRIPTION OF THE EMBODIMENTS

Figure 1:
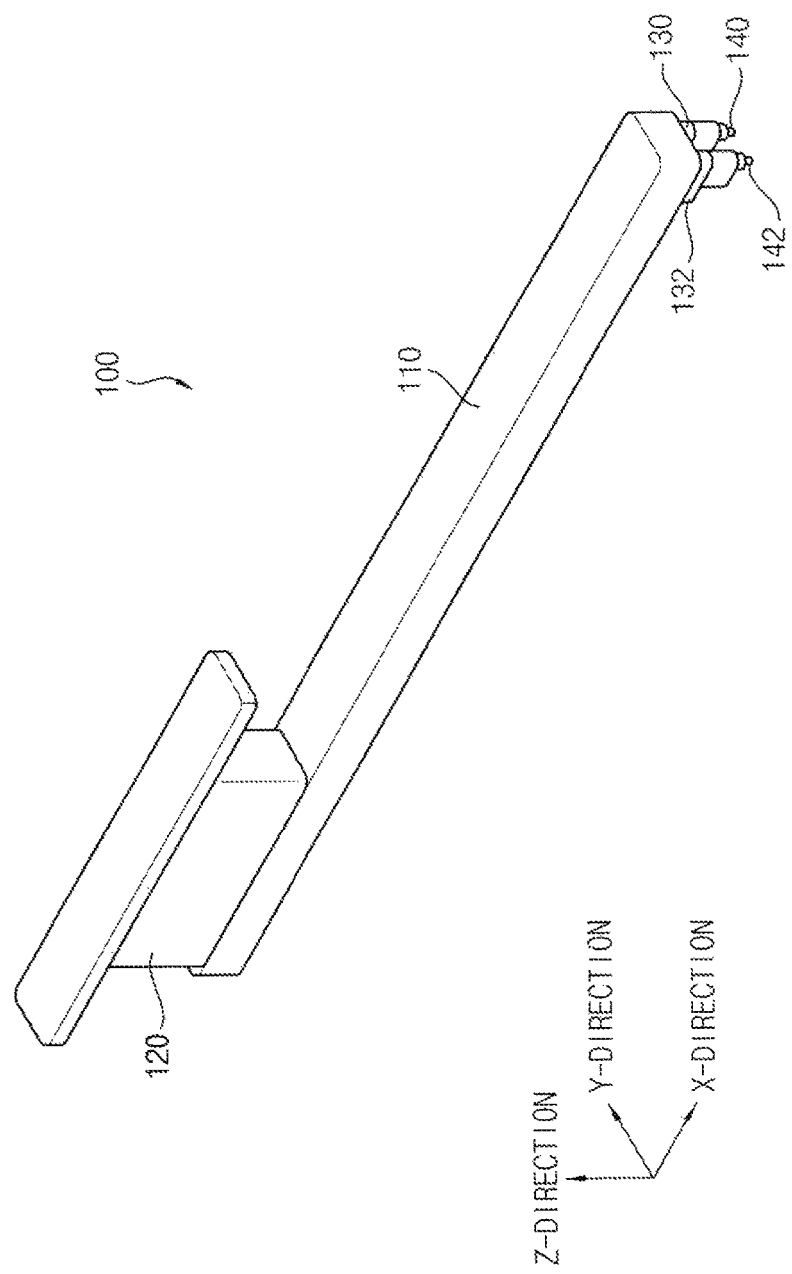
FIG. 1 is a perspective view illustrating a probe according to example embodiments.

Various example embodiments will now be described more fully with reference to the accompanying drawings in which some example embodiments are shown. However, the inventive concepts may be embodied in many alternate forms and should not be construed as limited to only example embodiments set forth herein.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present.

As used herein, components described as being "electrically connected" are configured such that an electrical signal can be transferred from one component to the other (although such electrical signal may be attenuated in strength as it transferred). Moreover, components that are "directly electrically connected" share a common electrical node through electrical connections by one or more conductors, such as, for example, wires, pads, internal electrical lines, through vias, etc. As such, directly electrically connected components do not include components electrically connected through active elements, such as transistors or diodes.

The various terminals (e.g., signal pads and power pads) described herein may be connected to internal circuitry within the device (e.g., semiconductor chip) to which they are connected, and may transmit signals and/or voltage to and/or from the device to which they are attached. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring. The pads may be formed of a conductive material, such a metal, for example.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Spatially relative terms, such as "beneath," "below," "lower," "above," "upper" and the like, may be used herein for ease of description to describe positional relationships, such as illustrated in the figures, e.g. It will be understood that the spatially relative terms encompass different orientations of the device in addition to the orientation depicted in the figures.

Figure 2:
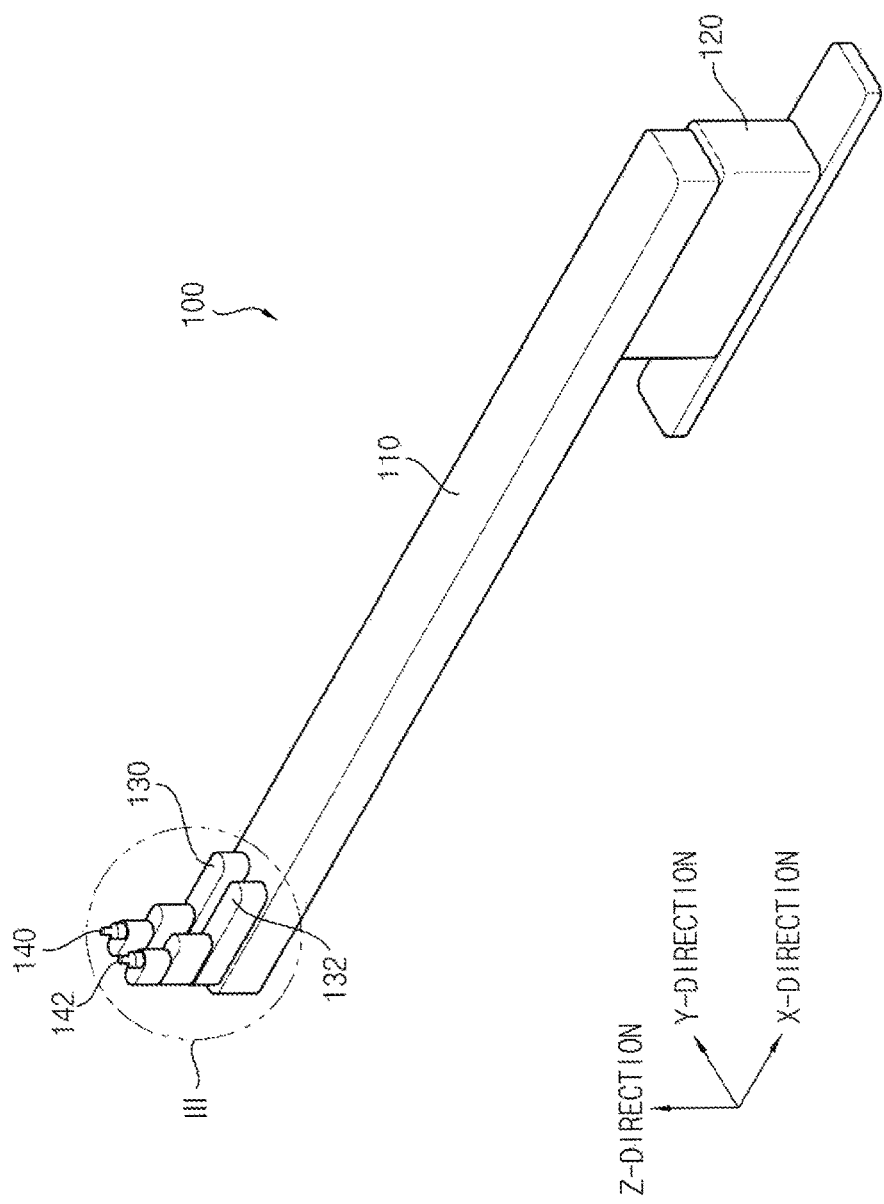
FIG. 2 is a perspective view illustrating a bottom side of the probe of FIG. 1 according to example embodiments.
Figure 3:
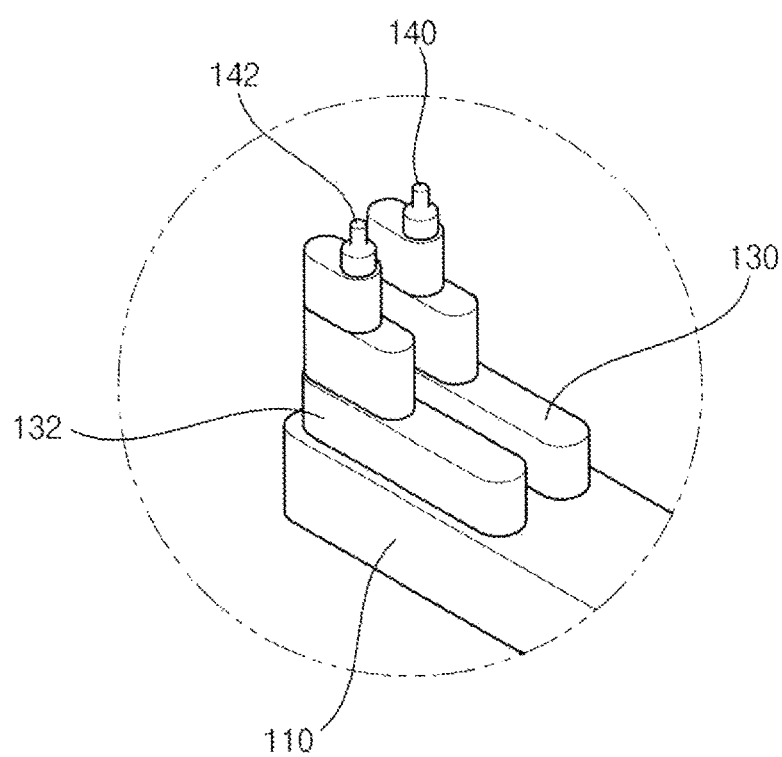
FIG. 3 is an enlarged view illustrating portion III of FIG. 2 according to example embodiments.

FIG. 1 is a perspective view illustrating a probe according to example embodiments. FIG. 2 is a perspective view illustrating a bottom side of the probe in FIG. 1 according to example embodiments. FIG. 3 is an enlarged view illustrating portion III of FIG. 2 according to example embodiments.

Referring to FIGS. 1 to 3, a probe 100 may include a beam 110, a post 120, a first base 130, a second base 132, a first tip 140 and a second tip 142.

The probe 100 may electrically connect a printed circuit board (PCB) of a probe card and a device under test (DUT), to transmit test signals from the PCB to terminals of the DUT. The probe 100 may include a conductive material capable of transmitting the test signals. For example, the probe 100 may include metal having elasticity, such as nickel/cobalt, nickel/boron, etc.

The DUT may include a semiconductor chip. In some embodiments, the DUT may include a semiconductor substrate including a plurality of semiconductor chips. The semiconductor chip may include a plurality of signal pads and a plurality of power pads. The signal pads and the power pads may correspond to the terminals of the DUT.

The beam 110 may have a horizontally long cuboid shape extending in a first direction. The beam 110 may have a first end portion and an opposite second end portion. The first end portion and the second end portion may be located at opposite ends of a longitudinal axis of the beam 110. The beam 110 may have a height H, a width W and a length L. The length L of the beam 110 may be measured along the first direction. The first direction may correspond to a length direction of the beam 110. The width W of the beam may be measured along a second direction substantially perpendicular to the first direction. The second direction may correspond to a width direction of the beam 110. The width W of the beam 110 may be substantially uniform along the length L of the beam 110. The height H of the beam 110 may be measured along a vertical direction orthogonal to both the first and second directions. The height H of the beam 110 may be substantially uniform along the length L of the beam 110. In the example of FIG. 1, the first direction corresponds to an X-direction, the second direction corresponds to a Y-direction, and the third direction corresponds to a Z-direction where such directions may be perpendicular to each other. In some embodiments, the beam 110 may have various shapes, such as, for example, a horizontally long cylinder shape.

The post 120 may be disposed on the first end portion (e.g., on a left upper surface) of the beam 110 as shown in FIG. 1. The post 120 may be electrically connected to the PCB. The test signals may be transmitted to the beam 110 via the post 120. The post 120 may be integrally coupled with the beam 110. Each of the beam 110 and the post 120 may comprise a conductor capable of transmitting the test signals, such as, for example, a metal.

The first base 130 may be disposed on the second end portion (e.g., a right lower surface) of the beam 110 as shown in FIG. 1. For example, the first base 130 may be disposed on a right portion of the right lower surface of the beam 110. In the embodiment of FIG. 1, the first base 130 may be disposed below a lower surface of the second end portion of the beam 110. The first base 130 may be integrally coupled with the beam 110. In some embodiments, the first base 130 may have a stepped structure having two steps. In other embodiments, the first base 130 may have a stepped structure having one step or three or more steps.

The second base 132 may be disposed on the second end portion (e.g., a left portion of the right lower surface) of the beam 110. The second base 132 may be disposed below the lower surface of the second end portion of the beam 110. The second base 132 may be spaced apart from the first base 130 in the second direction. The second base 132 may be integrally coupled with the beam 110. In some embodiments, the second base 132 may have a stepped structure having two steps. In other embodiments, the second base 132 may have a stepped structure having one step or three or more steps.

The first base 130 and the second base 132 may be electrically connected to the PCB. The test signals may be transmitted to the first base 130 and the second base 132 via the beam 110 and the post 120. Each of the first base 130 and the second base 132 may comprise a conductor capable of transmitting the test signals (e.g., metal).

The first base 130 and the second base 132 may be arranged in the second direction (i.e., the width direction of the beam 110). For example, the first base 130 and the second base 132 may be arranged below the lower surface of the second end portion of the beam 110, and parallel to one another in the Y-direction.

The first tip 140 may be disposed on the first base 130. The first tip 140 may contact the pads of the semiconductor chip. The first tip 140 may be integrally coupled with the first base 130.

The second tip 142 may be disposed on the second base 132. Since the second base 132 is spaced apart from the first base 130 in the second direction, the second tip 142 may be spaced apart from the first tip 140 in the second direction.

The second tip 142 may contact the pads of the semiconductor chip. The second tip 142 may be integrally coupled with the second base 132.

The first tip 140 and the second tip 142 may be electrically connected to the PCB, and the test signals may be transmitted to the first tip 140 and the second tip 142 via the first base 130 and the second base 132. Each of the first tip 140 and the second tip 142 may comprise a conductor, such as, for example, a metal.

Since the first and second bases 130 and 132 may be arranged in the width direction of the beam 110, the first and second tips 140 and 142 may be arranged in the width direction of the beam 110. The first tip 140 and the second tip 142 may be arranged in a direction at a predetermined angle to the length direction of the beam 110. Referring to the example of FIG. 1, in some embodiments, the first tip 140 and the second tip 142 may be arranged parallel to one another in the Y-direction perpendicular to the length direction (X-direction) of the beam 110. For example, the first tip 140 may be centered at position (X,Y1) and the second tip 142 may be centered at position (X,Y2).

As such, two (i.e., the first and second) tips 140 and 142 may be arranged on one beam 110 in the width direction of the beam 110, and thus the width W of the beam 110 may increase enough to accommodate the first and second tips 140 and 142. Since the first and second tips 140 and 142 are spaced apart from each other, the width W of the beam 110 may exceed a sum of widths of the first and second tips 140 and 142 that are measured along the second direction (Y-direction). For example, when each of the first and second tips 140 and 142 have a circular cross-section, the width W of the beam 110 may exceed a sum of diameters of the first and second tips 140 and 142.

When the length L and height H of the beam 110 according to the example embodiments having two tips is equal to a length and a height of a beam having one tip and a diameter of the one tip is equal to a diameter of each of the first and second tips 140 and 142, the width W of the beam 110 may be at least two times the width of the beam having the one tip. Thus, a volume of the beam 110 having two tips may be at least two times a volume of the beam having the one tip. Therefore, the beam 110 having the larger volume may have an improved current carrying capacity (CCC). Additionally, even though overcurrent is applied to the beam 110, the beam 110 having the larger volume is prevented from being damaged, for example, being burnt due to high temperature heating.

Since the probe 100 including the first and second tips 140 and 142 may be electrically connected to the pads of the semiconductor chip at the same time, the first and second tips 140 and 142 may concurrently contact adjacent power pads of the pads of the semiconductor chip. In some embodiments, when test signals having a same waveform are applied to adjacent signal pads of the pads of the semiconductor chip, the probe 100 having the first and second tips 140 and 142 may be concurrently electrically connected to the adjacent signal pads of the semiconductor chip.

In some embodiments, although not illustrated, the probe 100 may include three or more tips arranged along the width direction of the beam 110. For example, in some embodiments, the probe 100 may have three or more tips arranged in parallel to one another in the Y-direction. In such embodiments, the width W of the beam 110 may increase enough to accommodate all of the three or more tips. Since the three or more tips are spaced apart from each other, the width W of the beam 110 may exceed a sum of the widths of the three or more tips that are measured along the second direction (i.e., Y-direction). Further, when three or more tips are provided, three or more corresponding bases may be provided.

Further, in some embodiments, the probe 100 may only include the beam 110, the first tip 140 and the second tip 142. The first tip 140 and the second tip 142 may be directly disposed on the beam 110 in the width direction of the beam 110 without an intermediary (e.g., first base 130 and second base 132).

Figure 4:
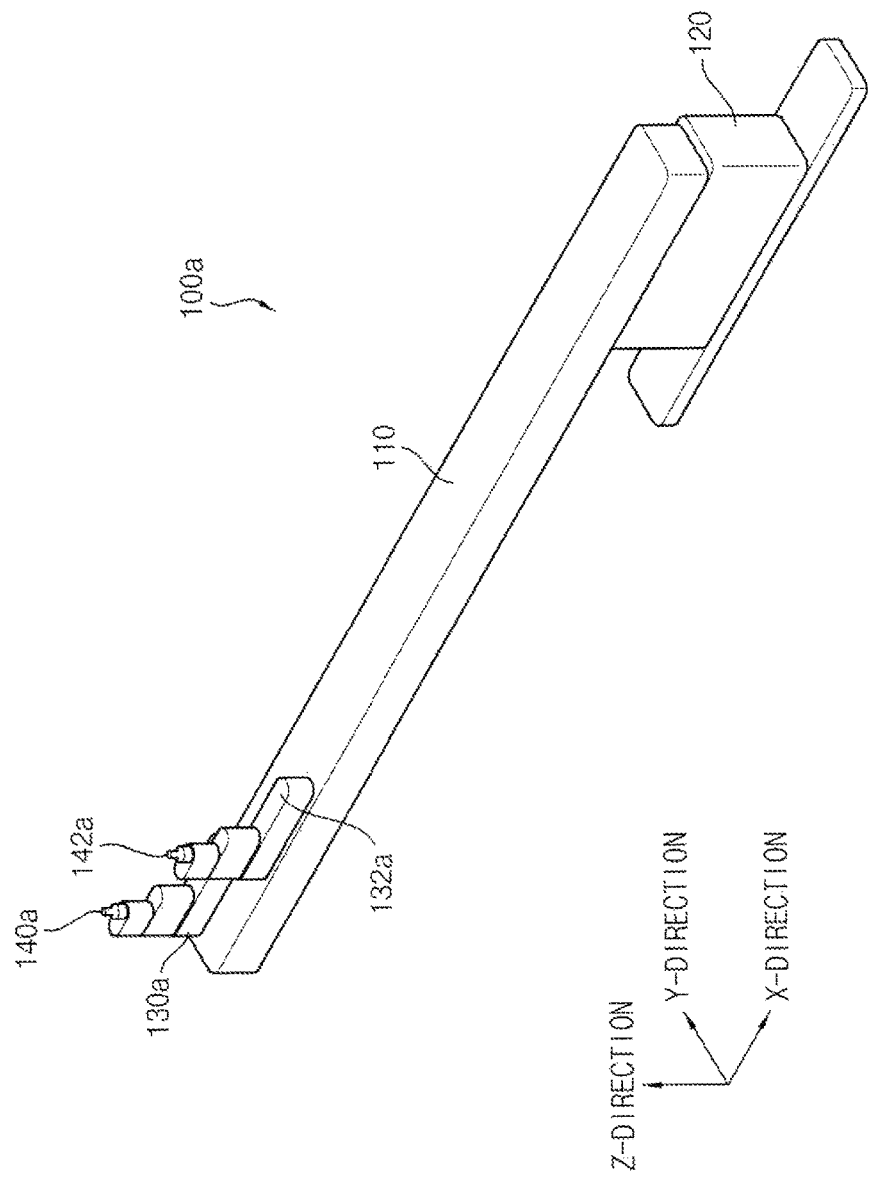
FIG. 4 is a perspective view illustrating a probe according to example embodiments.

FIG. 4 is a perspective view illustrating a probe according to example embodiments.

In example embodiments of FIG. 4, a probe 100a includes the same elements as those of the probe 100 of FIG. 2, except for the locations of the first and second bases and the first and second tips. The same reference numerals are used to denote the same elements as in FIGS. 1 to 3, and thus repeated descriptions thereof are omitted.

Referring to FIG. 4, a first base 130a and a second base 132a may be arranged in a direction at an acute angle to the length direction (X-direction) of the beam 110. For example, the first base 130a and the second base 132a may be arranged with respect to one another in a direction at 45° relative to the length direction (X-direction) of the beam 110. Thus, a first tip 140a and a second tip 142a may be also arranged with respect to one another in a direction at an acute angle relative to the length direction (X-direction) of the beam 110. The size of the acute angle may vary based on the relative locations of the first base 130a and the second base 132a (and, by extension, the first tip 140a and the second tip 142a). For example, the greater the distance between the first base 130a and the second base 132a along the X-direction, the more acute is the angle formed by the first and second bases 130a and 132a relative to the length direction of the beam 110. Conversely, the smaller the distance between the first base 130a and the second base 132a along the X-direction, the less acute is the angle formed by the first and second bases 130a and 132a relative to the length direction of the beam 110.

The arrangement direction of the first base 130a and the second base 132a may be determined based on an arrangement direction of the pads of the semiconductor chip. Therefore, the arrangement direction of the first tip 140a and the second tip 142a may be varied based on the arrangement direction of the pads of the semiconductor chip.

The first tip 140a and the second tip 142a may be spaced a predetermined distance apart from each other in the width direction (Y-direction) of the beam 110. In some embodiments, the first tip 140a and the second tip 142a may partly overlap each other in the width direction (Y-direction) of the beam 110.

The probe 100a may include the first and second tips 140a and 142a as shown in FIG. 4, but is not limited thereto. For example, the probe 100a may include three or more tips arranged with respect to one another in a direction at an acute angle relative to the length direction (X-direction) of the beam 110. The size of the acute angle may vary based on the relative locations of the three or more tips.

Figure 5:
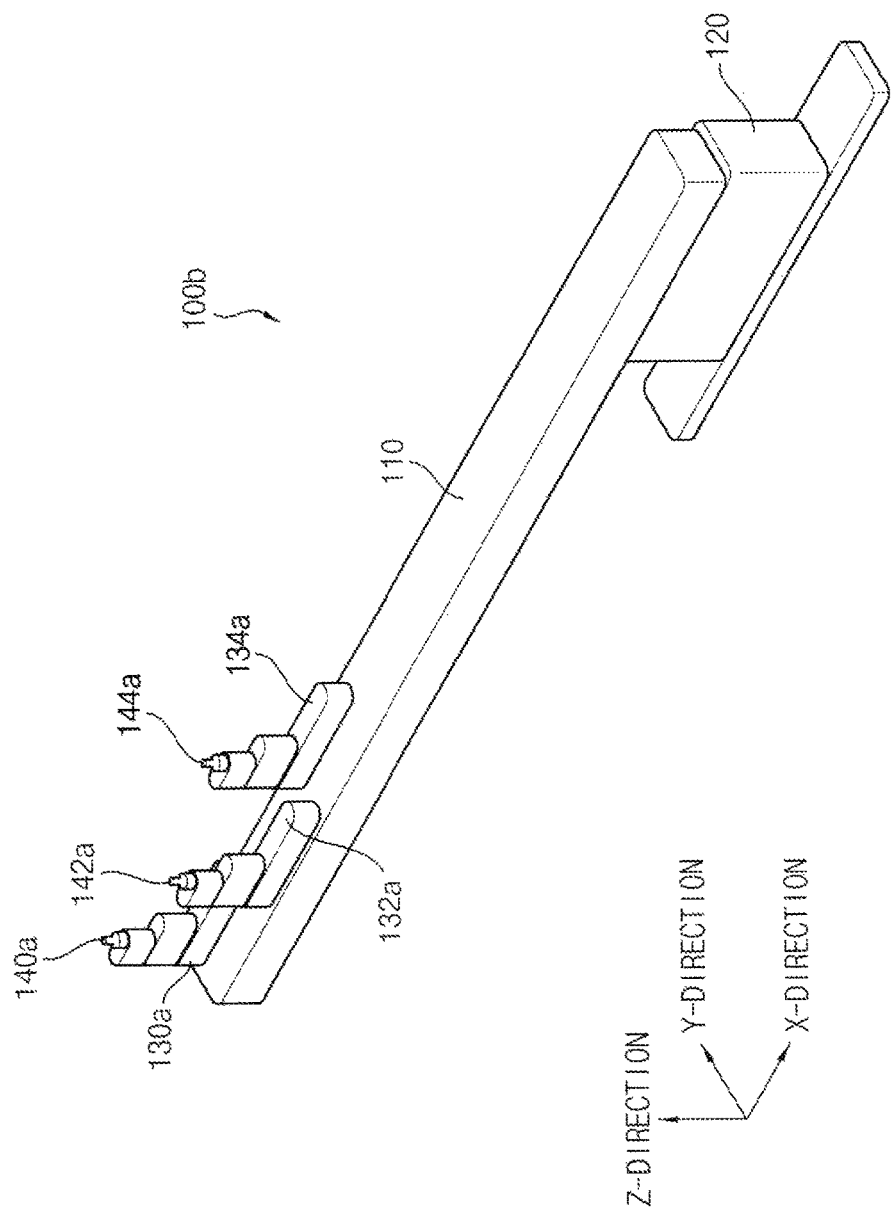
FIG. 5 is a perspective view illustrating a probe according to example embodiments.

FIG. 5 is a perspective view illustrating a probe according to example embodiments.

In example embodiments of FIG. 5, a probe 100b includes the same elements as those of the probe 100a of FIG. 4 except the probe 100b further includes a third base and a third tip. The same reference numerals are used to denote the same elements as in FIGS. 1 to 4, and thus repeated descriptions thereof are omitted.

Referring to FIG. 5, a first base 130a, a second base 132a and a third base 134a may be arranged in a zigzag form. The first base 130a and the second base 132a may be arranged in a direction at an acute angle to the length direction (X-direction) of the beam 110. The second base 132a and the third base 134a may be arranged in a direction at an obtuse angle to the length direction (X-direction) of the beam 110. The arrangement direction of the second and third bases 132a and 134a may be substantially perpendicular to the arrangement direction of the first and second bases 130a and 132a. For example, the first and second bases 130a and 132a may be arranged with respect to one another at a 45° angle relative to the X-direction, and the second and third bases 132a and 134a may be arranged with respect to one another at a 135° angle relative to the X-direction.

Thus, a first tip 140a and a second tip 142a may be arranged in a direction at an acute angle to the length direction of the beam 110. The second tip 142a and a third tip 144a may be arranged in a direction at an obtuse angle to the length direction (X-direction) of the beam 110. The arrangement direction of the second and third tips 142a and 144a may be substantially perpendicular to the arrangement direction of the first and second tips 140a and 142a. For example, the first and second tips 140a and 142a may be arranged with respect to one another at a 45° angle relative to the X-direction, and the second and third tips 142a and 144a may be arranged with respect to one another at a 135° angle relative to the X-direction.

The arrangement direction of the first to third bases 130a, 132a and 134a may be determined depending on an arrangement direction of the pads of the semiconductor chip. Therefore, the arrangement direction of the first to third tips 140a, 142a and 144a may be determined depending on the arrangement direction of the pads of the semiconductor chip.

The second tip 142a and the third tip 144a may be spaced a predetermined distance apart from each other in the width direction (Y-direction) of the beam 110. In some embodiments, the second tip 142a and the third tip 144a may partly overlap each other in the width direction (Y-direction) of the beam 110.

Figure 6:
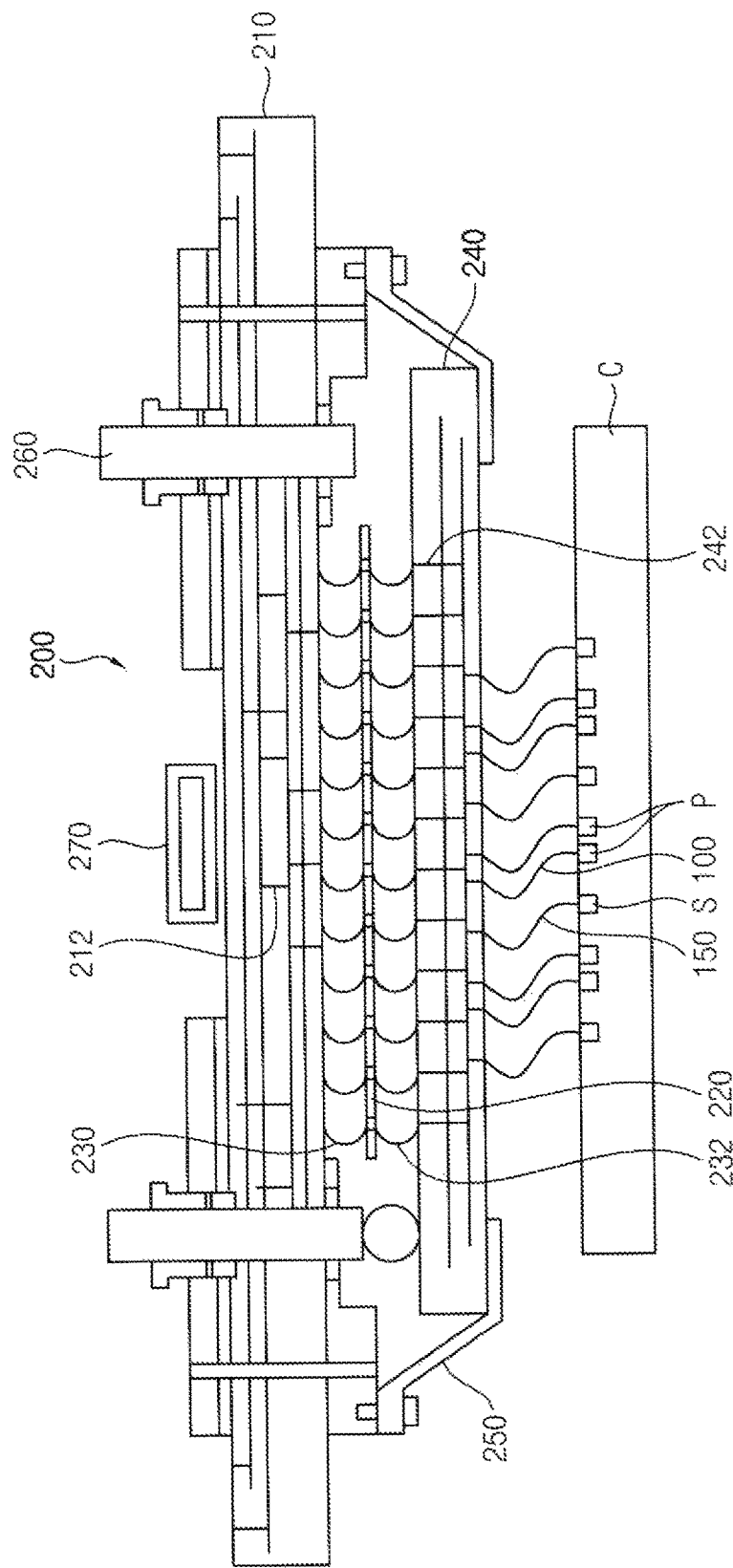
FIG. 6 is a cross-sectional view illustrating a probe card including the probe of FIG. 1 according to example embodiments.

FIG. 6 is a cross-sectional view illustrating a probe card including the probe of FIG. 1 according to example embodiments. FIG. 7 is an enlarged perspective view illustrating a contact relationship between first and second probes of the probe of FIG. 6 and pads of a semiconductor chip, according to example embodiments.

Referring to FIGS. 6 and 7, a probe card 200 may include a printed circuit board (PCB) 210, an interposer 220, a first pogo pin 230, a second pogo pin 232, a probing plate 240, a support plate 250, a pair of distance adjustment screws 260, a stiffener 270, at least one first probe 100 and a plurality of second probes 150.

The PCB 210 may include a multilayered substrate. The PCB 210 may include a test pattern 212. The test pattern 212 may be embedded in the PCB 210. The test pattern 212 may be connected to a tester for generating test signals. The test signals for testing a semiconductor chip C may flow through the test pattern 212.

The interposer 220 may be disposed below the PCB 210. The first pogo pin 230 may be disposed between the interposer 220 and the PCB 210 to electrically connect the test pattern 212 to the interposer 220. The second pogo pin 232 may be disposed below the interposer 220. The second pogo pin 232 may be electrically connected to the interposer 220.

The probing plate 240 may be disposed below the interposer 220. The probing plate 240 may include a probing pattern 242. The probing plate 240 may include an insulating material having a thermal expansion coefficient, capable of supplementing a thermal expansion coefficient difference between the PCB 210 and the semiconductor chip C. The probing plate 240 may include, for example, ceramic. The second pogo pin 232 may be disposed between the probing plate 240 and the interposer 220 to electrically connect the probing pattern 242 and the interposer 220.

The support plate 250 may support the probing plate 240. An upper end portion of the support plate 250 may be fixed or attached to the PCB 210. A lower end portion of the support plate 250 may support a lower surface of the probing plate 240.

The distance adjustment screws 260 may adjust a distance between the PCB 210 and the probing plate 240. The distance adjustment screws 260 may be screwed into the PCB 210 in a direction vertical to an upper surface of the PCB 210. Lower ends of the distance adjustment screws 260 may be connected to the probing plate 240. The distance between the PCB 210 and the probing plate 240 may be adjusted depending on a screwing amount of the distance adjustment screws 260.

The stiffener 270 may be disposed on a central portion of an upper surface of the PCB 210. The stiffener 270 may impart rigidity to the PCB 210.

The first probe 100 and the second probes 150 may be disposed on a lower surface of the probing plate 240. The first probe 100 and the second probes 150 may be electrically connected to the probing pattern 242 of the probing plate 240.

The first probe 100 may include the same elements as those of the probe 100 in FIG. 1. The same reference numerals are used to denote the same elements as in FIG. 1, and thus repeated descriptions thereof are omitted. In some embodiments, the first probe 100 may include the same elements as those of the probe 100a in FIG. 4 or the probe 100b in FIG. 5.

The first probe 100 may be electrically connected to two adjacent power pads P of the semiconductor chip C. A first tip 140 and a second tip 142 of the first probe 100 may concurrently contact the power pads P of the semiconductor chip C. For example, the first and second tips 140 and 142 of the first probe 100 may be brought into simultaneous contact with two adjacent power pads P of the semiconductor chip C, and power may be applied to the two adjacent power pads P through the first and second tips 140 and 142.

The second probes 150 may contact signal pads S of the semiconductor chip C. The second probes 150 may each include a beam 160, a post 170, a base 180 and a tip 190. The second probes 150 contacting the signal pads S may each include only one tip 190. The second probes 150 may each have a volume that is equal to about one half volume of the first probe 100.

The beam 160, the post 170, the base 180 and the tip 190 of each of the second probes 150 may have substantially the same structure as the beam 110, the post 120, the first base 130 and one of the first and second tips 140 and 142, respectively, of the first probe 100. Thus, repeated descriptions of the beam 160, the post 170, the base 180 and the tip 190 are omitted.

In some embodiments, when test signals having a same waveform are applied to adjacent signal pads S of the semiconductor chip C, the first probe 100 having two (i.e., first and second) tips 140 and 142 may be electrically connected to the signal pads S. For example, the first and second tips 140 and 142 of the first probe 100 may be brought into simultaneous contact with two adjacent signal pads S of the semiconductor chip C, and the test signals may be applied to the two adjacent signal pads S through the first and second tips 140 and 142.

FIG. 8 is a flow chart illustrating a method of manufacturing a semiconductor device, according to example embodiments.

Referring to FIG. 8, the manufacturing method 800 includes steps of providing a device under test (DUT) to a test chamber (S810), performing a testing process on the DUT (S820), removing the DUT from the test chamber (S830), and packaging the DUT into a semiconductor package (S840).

For example, referring to the embodiment of FIG. 7, the testing process may include bringing two or more tips (e.g., first and second tips 140 and 142) of a probe (e.g., the first probe 100) into contact with two adjacent power pads P of a DUT (e.g., semiconductor chip C), and applying power to the two adjacent power pads P through the two or more tips. The testing process may further include bringing two or more tips—whether the first and second tips 140 and 142 of the first probe 100 and/or tips of another probe—into contact with two adjacent signal pads S of the DUT (e.g., semiconductor chip C), and applying test signals to the two adjacent signal pads S through the two or more tips. The test chamber may include the probe card 200, as described in the previous embodiments of the current disclosure. The probe card 200 may include various features described with reference to FIGS. 1 through 7, including the first probe 100 and the second probes 150.

Packaging the semiconductor chips may include mounting one or more semiconductor chips onto a semiconductor package substrate, and encasing the mounted semiconductor chips with, e.g., a molding. A semiconductor package may be embodied in an electronic device, and may include a stack of semiconductor chips. In some embodiments, the semiconductor package may be embodied as a volatile or non-volatile memory. An electronic device, as used herein, may refer to the to these semiconductor devices or integrated circuit devices, and may additionally include products that include these devices, such as a memory module, memory card, solid state drive including additional components, or a mobile phone, laptop, tablet, desktop, camera, or other consumer electronic device, etc.

According to the above-described example embodiments, since at least two tips are arranged in the direction at a predetermined angle to the length direction of the beam, the beam may have a larger width exceeding a sum of the widths of the at least two tips in the width direction of the beam. Therefore, the probe may have an improved current carrying capacity and may be prevented from being damaged due to overcurrent.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A method comprising:
providing a device under test (DUT) to a test chamber;
performing testing on the DUT using a probe;
removing the DUT from the test chamber; and
packaging the DUT into a semiconductor package,
wherein the probe comprises:
a beam configured to transmit a test signal to the DUT, the beam extending in a length direction and having a first end portion and a second end portion aligned in the length direction; and
at least two tips disposed on the first end portion of the beam and configured to contact adjacent terminals of the DUT and transmit the test signal to the DUT,
wherein the at least two tips are arranged at an angle with respect to the length direction of the beam, and
wherein the at least two tips overlap one another in a second direction of the beam perpendicular to the length direction of the beam.

2. The method according to claim 1, wherein the second direction is a width direction and the at least two tips are aligned with one another in the width direction of the beam.

3. The method according to claim 1, wherein the at least two tips are offset in the length direction of the beam.

4. The method according to claim 1, wherein the beam has a width exceeding a sum of diameters of the at least two tips.

5. The method according to claim 1, further comprising:
at least two bases, each base being located between the beam and a corresponding one of the at least two tips.

6. The method according to claim 1, further comprising:
a post on the second end portion of the beam opposite to the first end portion of the beam.

7. The method according to claim 1, wherein the DUT includes a semiconductor chip, and
wherein the terminals of the DUT include power pads of the semiconductor chip.

8. The method according to claim 1, wherein the DUT includes a semiconductor chip, and
wherein the terminals of the DUT include signal pads of the semiconductor chip to which test signals having a same waveform among the test signals are applied.

9. A method comprising:
providing a device under test (DUT) to a test chamber;
performing testing on the DUT using a probe card;
removing the DUT from the test chamber; and
packaging the DUT into a semiconductor package,
wherein the probe card comprises:
a printed circuit board (PCB) including a test pattern through which test signals for testing the DUT flow;
a first probe including:
a beam connected to the test pattern; and
at least two first tips arranged on the beam with respect to one another in a direction that is at a predetermined angle relative to a length direction of the beam and configured to contact power pads of the DUT; and
a second probe connected to the test pattern, the second probe including a second tip configured to contact a signal pad of the DUT,
wherein the at least two first tips overlap one another in a width direction of the beam, the width direction being perpendicular to the length direction of the beam.

10. The method according to claim 9, wherein the at least two first tips are aligned with one another in the width direction of the beam.

11. The method according to claim 9, wherein the beam has a width exceeding a sum of widths of the at least two first tips in the width direction of the beam perpendicular to the length direction of the beam.

12. The method according to claim 9, wherein the probe card further comprises:
an interposer between the PCB and the first and second probes;
a first pogo pin configured to electrically connect the interposer to the test pattern of the PCB; and
a second pogo pin configured to electrically connect the interposer to the first and second probes.

13. The method according to claim 12, wherein the probe card further comprises:
   a probing plate below the second pogo pin, the probing plate including a probing pattern for electrically connecting the second pogo pin to the first and second probes.

14. The method according to claim 13, wherein the probe card further comprises:
   a support plate fixed to the PCB and configured to support the probing plate.

15. The method according to claim 13, wherein the probe card further comprises:
   a distance adjustment screw passing through the PCB to be connected to the probing plate, and wherein the distance adjustment screw is configured to adjust a distance between the PCB and the probing plate.

16. A method comprising:
   providing a device under test (DUT) to a test chamber;
   performing testing on the DUT using a probe card;
   removing the DUT from the test chamber; and
   packaging the DUT into a semiconductor package,
   wherein the probe card comprises:
      a printed circuit board (PCB) including a test pattern through which test signals for testing the DUT flow; and
      a first probe including:
         a beam connected to the test pattern; and
         at least two first tips arranged on the beam with respect to one another in a direction at a predetermined angle relative to a length direction of the beam and configured to contact power pads of the DUT,
   wherein the at least two first tips overlap one another in a width direction of the beam, the width direction being perpendicular to the length direction of the beam.

17. The method of claim 16, wherein the probe card further comprises:
   a second probe connected to the test pattern, the second probe including a second tip configured to contact a signal pad of the DUT.

18. The method of claim 17, wherein the probe card further comprises:
   an interposer between the PCB and the first and second probes;
   a first pogo pin configured to electrically connect the interposer to the test pattern of the PCB; and
   a second pogo pin configured to electrically connect the interposer to the first and second probes.

19. The method of claim 16, wherein the at least two first tips are aligned with one another in the length direction of the beam.

20. The method of claim 16, wherein the beam has a width exceeding a sum of widths of the at least two first tips in the width direction of the beam perpendicular to the length direction of the beam.

* * * * *